United States Patent [19]
Bergmann et al.

[11] Patent Number: 5,956,356
[45] Date of Patent: Sep. 21, 1999

[54] MONITORING WAVELENGTH OF LASER DEVICES

[75] Inventors: Ernest Eisenhardt Bergmann, Borough of Fountain Hill; Carl Edward Gaebe, Fleetwood, both of Pa.

[73] Assignee: Lucent Technologies Inc., Murray Hill, N.J.

[21] Appl. No.: 08/986,999

[22] Filed: Dec. 8, 1997

[51] Int. Cl.$^6$ .................................................. H01S 3/13
[52] U.S. Cl. ........................ 372/32; 372/20; 372/23; 372/24; 372/29; 372/33; 372/38
[58] Field of Search ........................ 372/29, 32, 33, 372/12, 20, 23, 26, 28, 38, 24

[56] References Cited

U.S. PATENT DOCUMENTS

| | | | |
|---|---|---|---|
| 4,309,671 | 1/1982 | Malyon | 372/32 X |
| 4,839,614 | 6/1989 | Hill et al. | 372/32 X |
| 4,914,662 | 4/1990 | Nakatani et al. | 372/32 |
| 5,003,546 | 3/1991 | Lidgard et al. | 372/26 |
| 5,825,792 | 10/1998 | Villeneuve et al. | 372/32 |

*Primary Examiner*—Brian Healy
*Attorney, Agent, or Firm*—Lester H. Birnbaum

[57] ABSTRACT

The invention is a circuit for monitoring the wavelength of a laser device such as a semiconductor laser. A piezoelectric resonator is positioned in the path of the light beam so as to form a Fabry-Perot cavity. The changes in the reflectivity of the cavity are detected as the resonator is driven by an oscillator circuit, and an error signal is produced in response thereto when the wavelength of the laser device strays from a desired value.

12 Claims, 4 Drawing Sheets

$\lambda_{MIN} = \lambda_S$

MONITORING WAVELENGTH OF LASER DEVICES

FIELD OF THE INVENTION

This invention relates to laser devices, and in particular to monitoring the wavelength of such devices.

BACKGROUND OF THE INVENTION

In optoelectronics systems, semiconductor lasers will often experience changes in wavelength due to aging and temperature variations. This shifting of the wavelength is particularly critical in dense wavelength division multiplexing applications where different channels are separated by a small wavelength difference, typically corresponding to an optical frequency difference of 50–500 Ghz. There is often a need to closely monitor the wavelength, and if it is drifting away from its desired value, to supply an error signal that is fed back to a wavelength control.

A standard approach to this monitoring function would be to use two tapped optical signals passed through two optical filters and detected by two photodetectors. The two resulting electrical signals are passed to a balanced, differential comparator to produce the error signal. Such a technique is suitable as long as the two optically tapped signals, the optical filters, and the two photo-detectors all remain stable, and this is not always the case.

SUMMARY OF THE INVENTION

The invention is a circuit for monitoring the wavelength of a laser device which includes a piezoelectric resonator positioned in the path of a light beam from the device. The resonator acts like a solid Fabry-Perot cavity. Means are also provided for varying the thickness of the resonator to change the reflectivity of the cavity as a function of wavelength. Further means detects the changes in the reflectivity of the cavity and produces an error signal in response thereto when the wavelength of the light beam varies from a desired value.

BRIEF DESCRIPTION OF THE FIGURES

These and other features of the invention are delineated in detail in the description to follow. In the drawings.

It will be appreciated that, for purposes of illustration, these figures are not necessarily drawn to scale.

DETAILED DESCRIPTION

Figure 1:
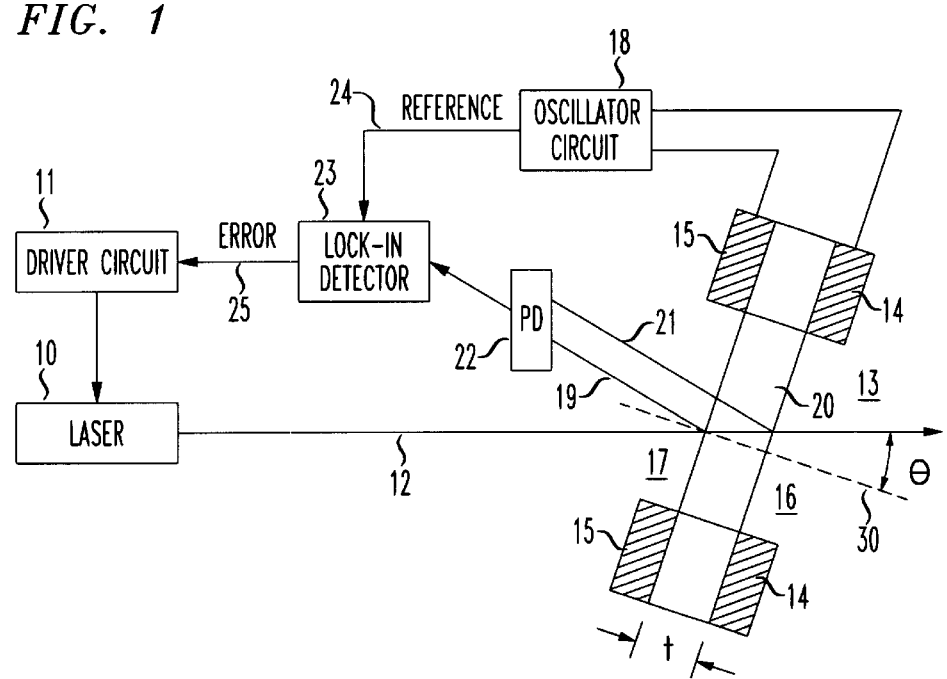
FIG. 1 is schematic illustration of a circuit in accordance with an embodiment of the invention.

FIG. 1 illustrates a typical embodiment of the invention. In this example, a standard laser, 10, such as a 1550 nanometer, DFB single-mode laser, needs to be stabilized. The laser, 10, is biased by a standard drive circuit, 11, to produce a light beam, illustrated by horizontal line, 12.

A piezoelectric resonator, 13, is positioned in the path of the light beam. The resonator includes a crystalline element, 20, such as quartz, which has a thickness, t, and is cut to vibrate in the thickness mode. Electrodes, 14 and 15, are formed on or close to both major surfaces of the crystal, 20. Each electrode, 14 and 15, includes an aperture, 16 and 17, respectively, to permit passage of the light beam and any reflected light therethrough. The electrodes are driven by a standard r.f. oscillator circuit, 18, which causes the resonator to vibrate typically at an r.f. frequency. The r.f. oscillator, 18, may in fact be frequency controlled by the resonator, 13, according to the crystal's mechanical resonant frequency. It will be appreciated that, aside from the apertures, 16 and 17, the resonator, 13, can be a standard, commercially available, thickness mode resonator.

It will be noted that a first portion of the beam, 12, illustrated by line 19, is reflected by the front surface of the crystal, 20, and a second portion of the beam, 12, illustrated by line 21, is reflected by the back surface of the crystal. These portions are transmitted back through aperture 17. The resonator, 13, is tilted slightly, (typically, the normal, 30, to the front surface makes an angle, θ, which is 1–20 degrees to the beam 12), so that the reflected portions, 19 and 21 (which overlap), are both incident on a standard photodetector, 22. The photodetector, 22, is electrically coupled to a lock-in detector, 23, which also receives, on electrical connection, 24, an r.f. signal for example, that supplied by the oscillator circuit, 18, that drives the electrodes, 14 and 15. The output of the lock-in detector 23 provides monitoring of the wavelength deviation as described below. The lock-in detector, 23, is electrically coupled to the drive circuit, 11, by means of connection 25, in order to vary the drive signal supplied to the laser, 10, in a manner to be described.

Figure 2:
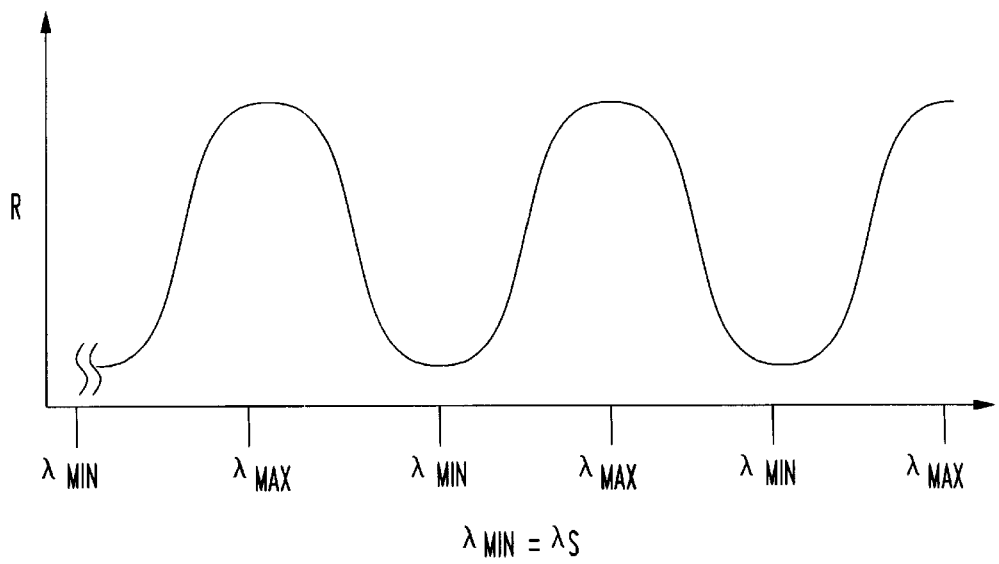
FIGS. 2 and 3 are graphs of cavity reflectivity as a function of wavelength illustrating a feature of the invention.

It will be recognized that the reflected portions, 19 and 21, will form interference patterns which are a function of the wavelength of the laser beam, the thickness and index of refraction of the crystal, 20, and the angles of incidence which beam 12 makes with the surfaces of resonator 20. It will be noted that the index of refraction may in turn, depend upon polarization of the beam, 12, and orientation of the optic axis of the crystal, 20, if the crystal is birefringent. FIG. 2 illustrates a portion of the reflectivity curve when no electrical drive is supplied to the resonator, where the Y-axis is the power of the combined reflective portions, 19 and 21, as determined by the photodetector, 22, and the X-axis is the wavelength of the laser beam, 12. The values $\lambda_{min}$ indicate the wavelengths at which the reflectivity is a minimum (usually essentially zero). In this example, the resonator crystal thickness, t, and tilt, θ, are chosen so that one $\lambda_{min}$ corresponds to the desired wavelength, $\lambda_s$, of the laser, 10 (i.e., $\lambda_{min}=\lambda_s$).

When the oscillator circuit, 18, applies a periodic signal (particularly near the resonance frequency) to the resonator electrodes, the curve illustrated in FIG. 2 will shift slightly to the left and right in response to changes in the instantaneous thickness of the resonator 20. The lock-in detector, 23, will detect and report any changes in the signal from the photodetector, 22, which are synchronous with the rapid vibrations of the crystal produced by the r.f. periodic signal (reference signal) applied to the electrodes of the resonator, 13, by the oscillator circuit, 18. As long as the laser wavelength, $\lambda_s$, is equal to $\lambda_{min}$ there will be no detected change in the photodetector signal since the slope of the reflectivity curve at $\lambda_{min}$ is essentially zero.

Figure 3:
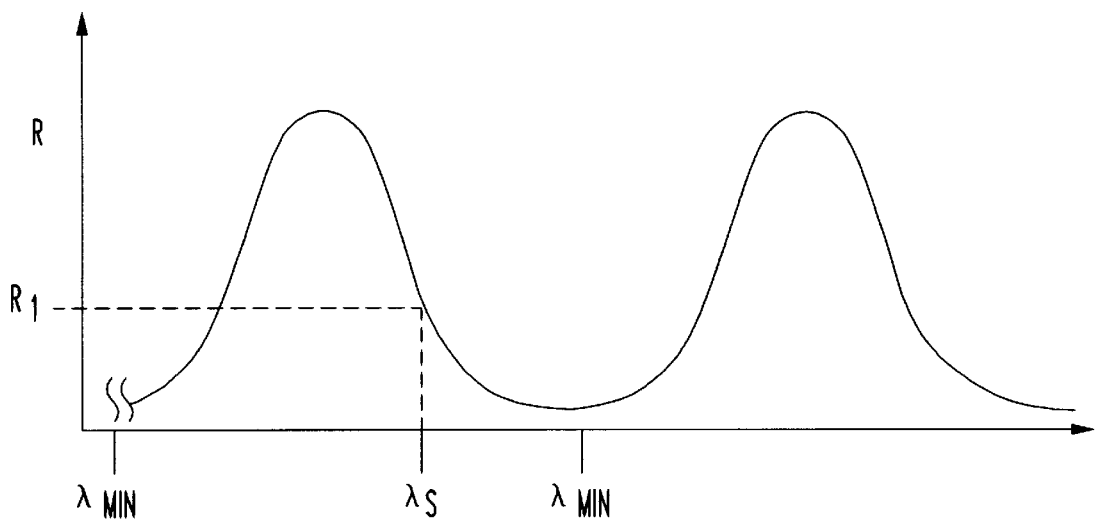

Assume, however, that over a period of time the wavelength, $\lambda_s$ has drifted away from $\lambda_{min}$ as illustrated in FIG. 3. Now, when the periodic signal is applied by the oscillator circuit, 18, to the resonator electrodes, the lock-in detector, 23, will detect a change in the signal from the photodetector as the curve shifts. This detected signal will be proportional to the slope of the reflectivity curve in the vicinity of $\lambda_s$ and will have a negative value in this example since the slope is negative. (If $\lambda_s$ had drifted to the other side of $\lambda_{min}$, the value would have been positive.) In response to this detected signal, the lock-in detector transmits to the drive circuit, 11, an error signal which is approximately proportional to the amount by which the wavelength of the laser, $\lambda_s$ has drifted from the desired value, $\lambda_{min}$. The drive circuit, 11, then re-adjusts the laser bias and thereby the wavelength in order to return the wavelength of the laser beam, 12, to its desired value. Alternatively, the error signal from the lock-in detector could be transmitted to means such as a thermoelectric cooler (not shown), to adjust the temperature of the laser to return to the desired wavelength. It will be appreciated therefore, that the primary function of the embodiment is to monitor the wavelength of the laser. The resulting error signal can be used in a number of ways to stabilize the laser wavelength.

As known in the art, the desired thickness, t, of the resonator crystal, 20, can be controlled during fabrication by monitoring the r.f. resonance frequency to achieve a wavelength, $\lambda_{min}$ which is equal to the desired laser wavelength, $\lambda_s$. If the wavelengths do not exactly coincide, the angle, θ, can be adjusted to achieve closer coincidence. Since quartz crystals tend to be birefringent, it is recommended that the laser beam have a specific polarization, which is the case for most laser diodes used in fiber optic telecommunications. Crystal orientations and polarization can be chosen to minimize any temperature dependence of the resonator, 13.

Figure 4:
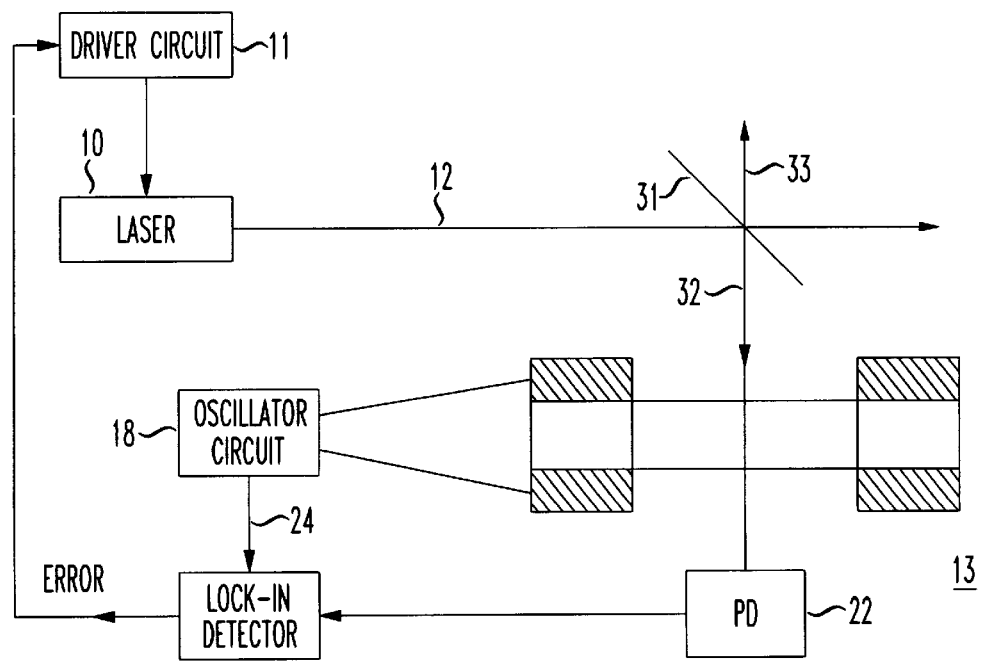
FIG. 4 is a schematic illustration of a circuit in accordance with a further embodiment.
Figure 5:
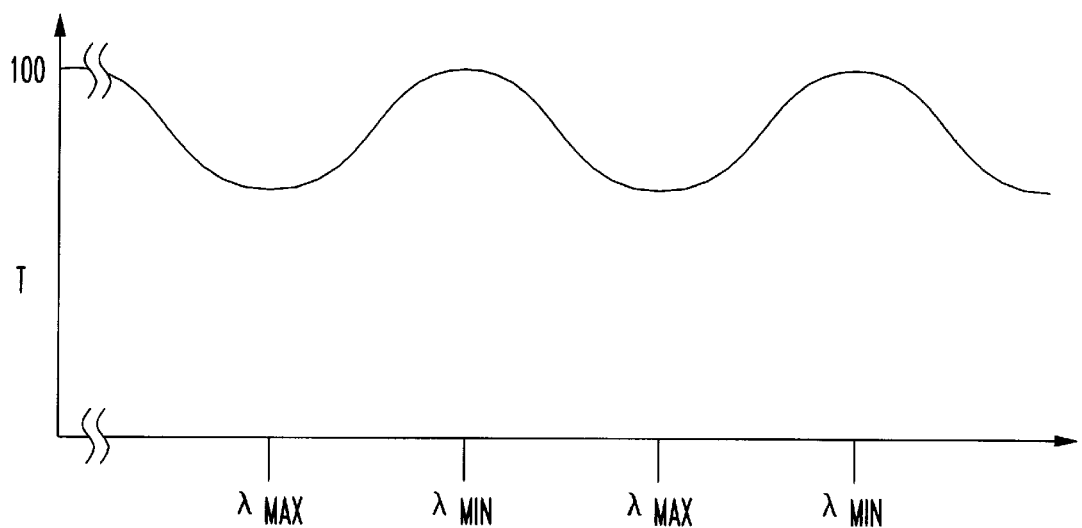
FIG. 5 is a graph of cavity transmission as a function of wavelength, illustrating a feature in accordance with the further embodiment.

FIG. 4 illustrates a further embodiment, where elements corresponding to those of FIG. 1 are similarly numbered. In this embodiment, a portion of the beam, 12, from the laser is deflected by a beam splitter, 31, and the remainder of the beam is transmitted and remains unmodulated. The resonator, 13, is placed in the path of the deflected beam, 32, and the detector, 22, is used to detect the portion of the deflected beam, 32, which is transmitted through the resonator rather than reflected by the resonator as in the previous embodiment. This embodiment, therefore, makes use of the transmission curve of FIG. 5, which is essentially the inverse of the reflectivity curve shown in FIG. 2, i.e., $\lambda_{min}$ corresponds to maximum transmission and $\lambda_{max}$ corresponds to minimum transmission. As before, $\lambda_s$ can be made to coincide with a $\lambda_{min}$, and then when the resonator is driven, the curve of FIG. 5 will shift to the left and right to provide an error signal if $\lambda_s$ drifts from $\lambda_{min}$. It will be noted that, in this embodiment, the resonator, 13, can be oriented so that the normal to the surface makes an angle of zero with respect to the beam, 32. Consequently, the invention in general contemplates tilt angles in the range 0–20 degrees. It will be noted that this embodiment could be used to monitor the reflected beam, 33, from the resonator as in the embodiment of FIG. 1.

It will be appreciated that the invention utilizes a piezoelectric resonator to form a Fabry-Perot cavity where the reflectivity of the cavity as a function of wavelength is varied by driving the resonator electrodes. Changes in the reflectivity of the cavity are detected either by looking at the reflected or transmitted light, and an error signal is produced in response thereto when the laser wavelength drifts from its desired value, i.e., away from an area of essentially no slope on the reflectivity or transmission curves.

Figure 7:
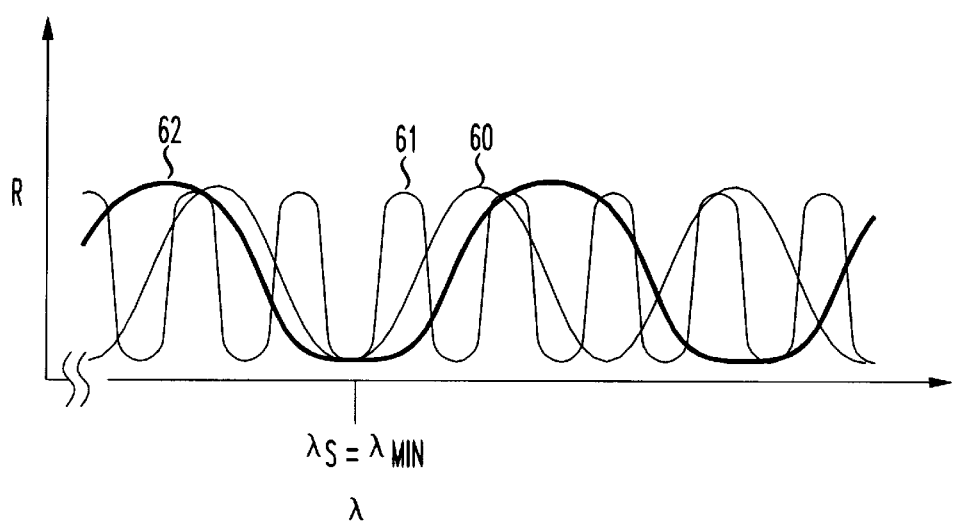
FIG. 7 is a graph of cavity reflectivities as a function of wavelength in accordance with the embodiment of FIG. 6.
Figure 6:
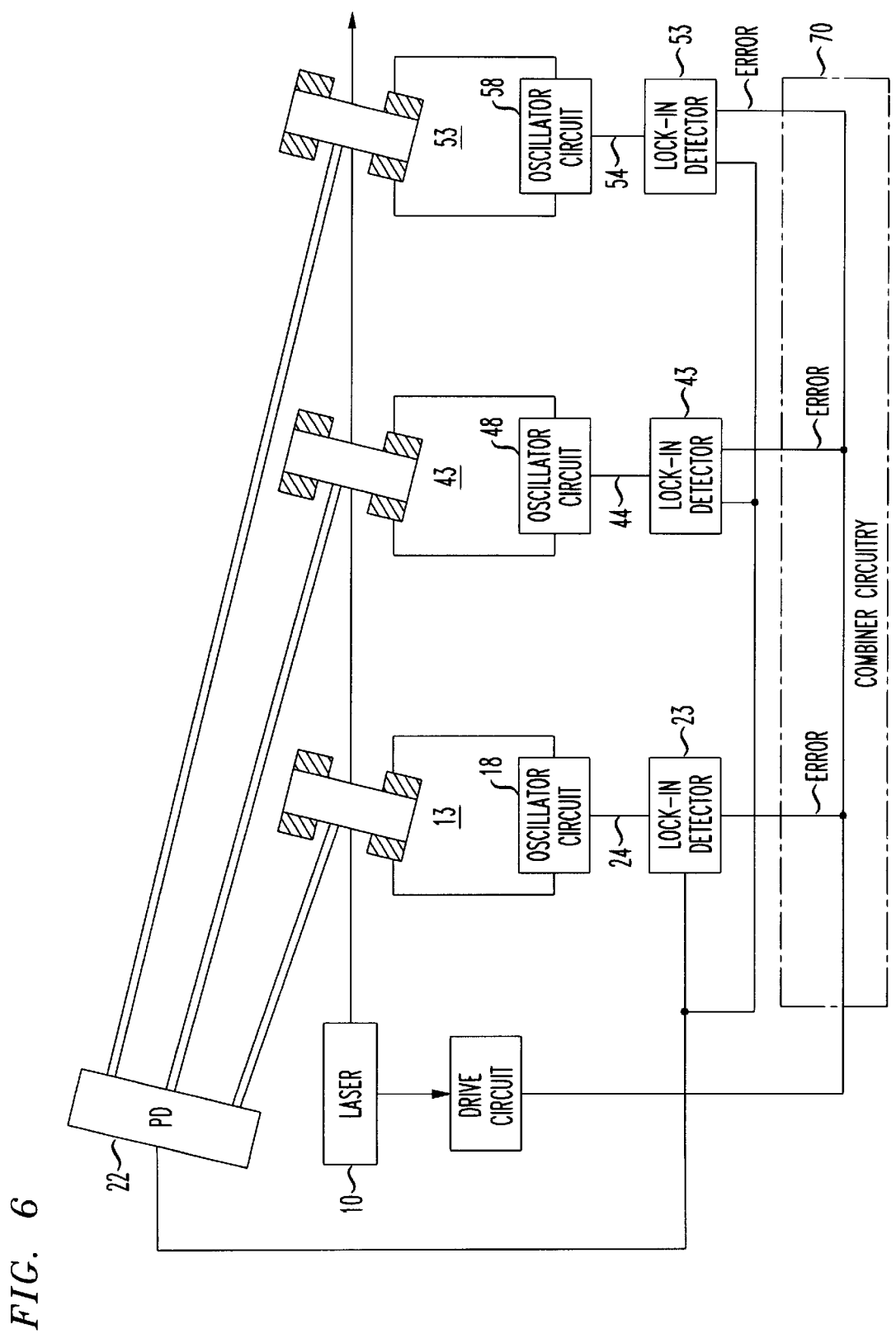
FIG. 6 is a schematic illustration of a circuit in accordance with a still further embodiment.

If desired, one or more additional resonators may be placed in the path of the laser beam, as illustrated, for example, in the embodiment of FIG. 6. Here, the resonators 13, 43 and 53 are each driven at a different frequency and/or phase by oscillator circuits 18, 48 and 58 respectively. The light reflected by each resonator is detected by photodetector 22 which is coupled to a lock-in detector, 23, 43 and 53, receiving a reference signal from a corresponding oscillator circuit 18, 48 and 58. Each lock-in detector produces an error signal which is coupled to a combiner circuit, 70. As illustrated in FIG. 7, the reflectivity curves, 60, 61 and 62, of the resonators, 13, 43 and 53, will have sine waves of different frequency. The advantage of using this design for a single wavelength laser is that the desired wavelength $\lambda_s$ can be chosen to correspond to a minimum, $\lambda_{min}$, for any or all curves as shown depending upon details in the combiner circuit, 70. This makes it easier to lock the laser wavelength onto the appropriate minimum value of any of the resonators. In wavelength division multiplexed systems, each resonator can be used to monitor a different wavelength. It will be appreciated that transmission mode detection similar to FIG. 4 can also be used with multiple resonators.

It will be appreciated that optical coatings can be employed to alter the reflectivity of the resonator surfaces. One can reduce the amount of reflection and thereby preserve more of the laser beam for transmission, or alternatively, one can increase the amount of reflection of each surface to thereby increase the power and sensitivity of the monitoring signal.

Various additional modifications will become apparent to those skilled in the art. For example, although in the examples given, the wavelength $\lambda_s$ of the laser is made to correspond to a minimum value, $\lambda_{min}$ of the reflectivity curve, it could also be made to correspond to a maximum value $\lambda_{max}$ (see FIG. 2). The preferred embodiment is that $\lambda_s$ corresponds to a portion of the curve with essentially zero slope. Also, the wavelength of the laser could be monitored by use of light from the backface of the laser rather than the forward beam 12. Further, where more than one resonator is employed, the resonators could have the same thickness but different tilt angles and driven by oscillator circuits of different phase or of slightly different frequencies to produce different, measurable reflectivity curves to aid in locking onto the desired maximum or minimum. Alternatively, the same oscillator could be used, but a phase shift introduced before applying the r.f. signal to one of the resonators.

What is claimed is:

1. A circuit for monitoring the wavelength of a laser device comprising:

a piezoelectric resonator positioned in the path of a light beam from the device, the resonator producing a solid Fabry-Perot cavity;

means for varying the thickness of the resonator to change the reflectivity of the cavity as a function of wavelength; and means for detecting the changes in the reflectivity of the cavity and producing an error signal in response thereto when the wavelength of the device varies from a desired value.

2. The circuit according to claim 1 wherein the resonator comprises a front and back surface, each of which reflects a portion of the light beam to produce two reflected beams which form an interference pattern.

3. The circuit according to claim 1 wherein the laser device comprises a semiconductor laser.

4. The circuit according to claim 2 wherein the resonator further comprises electrodes on the front and back surfaces, the electrodes each including an aperture formed therein to permit passage of the light beam through the resonator.

5. The circuit according to claim 1 wherein the means for varying the thickness of the resonator comprises an oscillator circuit.

6. The circuit according to claim 1 wherein the means for detecting changes and producing an error signal comprises a photodetector and a lock-in detector coupled to the photodetector.

7. The circuit according to claim 1 wherein the circuit further comprises a drive circuit for controlling the laser device, and the error signal is fed back to the drive circuit.

8. The circuit according to claim 1 wherein the resonator is tilted so that a line normal to a major surface of the resonator makes an angle within the range 0–20 degrees to the light beam.

9. The circuit according to claim 1 wherein the reflectivity of the cavity as a function of wavelength has a zero slope at a certain wavelength which is equal to the desired wavelength of the laser device.

10. The circuit according to claim 9 wherein the desired wavelength is equal to a minimum on the reflectivity curve.

11. The circuit according to claim 6 wherein the photodetector is positioned to receive a portion of the beam reflected by the resonator.

12. The circuit according to claim 6 wherein the photodetector is positioned to receive a portion of the beam transmitted through the resonator.

* * * * *